United States Patent
Eu et al.

(10) Patent No.: US 9,030,000 B2
(45) Date of Patent: May 12, 2015

(54) MOLD CAP FOR SEMICONDUCTOR DEVICE

(71) Applicants: Poh Leng Eu, Petaling Jaya (MY); Boon Yew Low, Petaling Jaya (MY); Kai Yun Yow, Petaling Jaya (MY)

(72) Inventors: Poh Leng Eu, Petaling Jaya (MY); Boon Yew Low, Petaling Jaya (MY); Kai Yun Yow, Petaling Jaya (MY)

(73) Assignee: Freescale Semiconductor, Inc., Austin, TX (US)

(*) Notice: Subject to any disclaimer, the term of this patent is extended or adjusted under 35 U.S.C. 154(b) by 118 days.

(21) Appl. No.: 13/917,641

(22) Filed: Jun. 14, 2013

(65) Prior Publication Data
US 2014/0367840 A1    Dec. 18, 2014

(51) Int. Cl.
*H01L 23/31* (2006.01)
*H01L 21/56* (2006.01)
*H01L 23/00* (2006.01)

(52) U.S. Cl.
CPC ........ H01L 23/3107 (2013.01); H01L 23/3128 (2013.01); H01L 21/565 (2013.01); *H01L 24/32* (2013.01); *H01L 24/48* (2013.01); *H01L 24/73* (2013.01); H01L 24/97 (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01); *H01L 2224/97* (2013.01); *H01L 2924/15311* (2013.01); *H01L 2924/1815* (2013.01)

(58) Field of Classification Search
CPC .......................... H01L 23/31; H01L 23/3107
USPC .......................... 257/687, 704, 730, E23.123
See application file for complete search history.

(56) References Cited

U.S. PATENT DOCUMENTS

| | | | | |
|---|---|---|---|---|
| 5,767,446 A | * | 6/1998 | Ha et al. | 174/523 |
| 5,841,192 A | * | 11/1998 | Exposito | 257/701 |
| 5,886,398 A | | 3/1999 | Low | |
| 6,064,117 A | * | 5/2000 | Barrett | 257/738 |
| 6,157,086 A | * | 12/2000 | Weber | 257/788 |
| 6,177,724 B1 | * | 1/2001 | Sawai | 257/701 |
| 6,340,792 B1 | | 1/2002 | Hirokawa | |
| 6,452,268 B1 | * | 9/2002 | Huang | 257/730 |
| 6,562,272 B1 | * | 5/2003 | Chang et al. | 264/272.14 |
| 6,825,067 B2 | | 11/2004 | Ararao | |
| 7,355,278 B2 | * | 4/2008 | Shibata et al. | 257/730 |
| 2014/0319682 A1 | * | 10/2014 | Sidhu et al. | 257/738 |

* cited by examiner

*Primary Examiner* — Joseph C Nicely
(74) *Attorney, Agent, or Firm* — Charles Bergere

(57) ABSTRACT

A semiconductor package has a substrate with a solder mask layer, and upper and lower surfaces. Conductive traces and electrical contacts are formed on the substrate, and vias are formed in the substrate to electrically connect the conductive traces and electrical contacts. A semiconductor die is attached on the upper surface of the substrate. A mold cap is formed on the upper surface of the substrate and covers the die and the conductive traces. The mold cap includes a mold body having clipped corners and extensions that extend from each of the clipped corners. The extensions and clipped corners help prevent package cracking.

8 Claims, 4 Drawing Sheets

MOLD CAP FOR SEMICONDUCTOR DEVICE

BACKGROUND OF THE INVENTION

The present invention relates generally to integrated circuit packaging and, more particularly, to integrated circuit packages formed on laminated substrates, such as BGA (Ball Grid Array) and PBGA (Plastic Ball Grid Array) packages.

As integrated circuits become more complex, a need has arisen for an integrated circuit package having a greater number of high-density, reliable, external electrical connections. For the integrated circuit package, it is desirable to include one or more conductive layers for signal routing and/or provision of ground and/or power planes. To meet these needs, substrate-based packages such as BGA have been developed.

In addition, to protect the semiconductor dies and bond wires from damage during handling, physical protection means such as a mold cap is formed on the substrate. A mold cap is formed on the substrate by a transfer or injection molding process. To prevent voids, the mold cap usually has chamfered areas at each of the corners of the substrate. These chamfered corners, unfortunately, leave the corners of the substrate exposed. Thus, the solder mask at the substrate corners is susceptible to cracking during handling. Larger size packages (e.g., 29 mm×29 mm and 31 mm×31 mm) are even more susceptible to solder mask cracking.

FIGS. 1 and 2 show a conventional molded BGA device 10. The device 10 includes a substrate 100 having a plurality of conductive traces 102 and vias 104 (only one is shown), a semiconductor die 106 attached to the substrate 100 with a die attach material 108, and a mold cap 110 formed on the substrate 100 to cover and protect the die 106 and bond wires 112 that electrically connect the die 106 to the conductive traces 102 of the substrate 100. The semiconductor package 10 also has external electrical connectors in the form of solder balls 114. Typically, before forming the mold cap 110, a solder mask 116 is formed on the substrate 100 to prevent corrosion and oxidation of the conductive traces 112 of the substrate 100.

As can be seen in FIG. 1, the corners 118 of the mold cap 110 are clipped or chamfered so that the sides 120 of the mold cap 110 do not intersect at right angles. This has been found useful to prevent the intrusion of moisture between the junction of the mold cap 110 and the upper surface of the substrate 100. However, the clipped corners 118 of the mold cap 110 expose the solder mask 116. During handling, the exposed solder mask 116 has a high risk of cracking, which in turn makes the traces 102 susceptible to fracture.

Therefore, it would be desirable to improve the integrated circuit packages to solve the above problem.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying Figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

According to one embodiment of the present invention, a semiconductor package comprises a substrate having upper and lower surface. Conductive traces are formed in the substrate for routing electrical signals, and electrical contacts are on the substrate lower surface. Vias are provided to connect the conductive traces and the electrical contacts. A semiconductor die is attached on the upper surface of the substrate and electrically connected to the conductive traces. A solder mask also is formed over the upper surface of the substrate. A mold cap then is formed over the semiconductor die and electrical connections between the die and the conductive traces. The mold cap includes a mold body having chamfered corners. A plurality of extensions respectively extend from each of the chamfered corners of the mold body. The extensions preferably do not extend all the way to the substrate edges.

In another embodiment of the present invention, the plurality of extensions have a height that is less than a height of the mold body, and a length that is two thirds (⅔) the distance from the clipped corners of the mold body to the corresponding corners of the substrate. In an embodiment of the present invention, the plurality of extensions are shaped as a rectangle with a flat or radius top, and are formed together with the mold body.

Since the mold cap is provided with extensions extending from the chamfered corners, a greater area of the solder mask that would be otherwise exposed due to the chamfered corners is covered by the extensions, which reduces the risk of cracking of the solder mask and conductive traces.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiments disclosed may be readily used as a basis for modifying or designing other structures or processes for carrying out the same purposes of the present invention. It should also be realized by those skilled in the art that such equivalent constructions do not depart from the spirit and scope of the invention as set forth in the appended claims.

Figure 1:
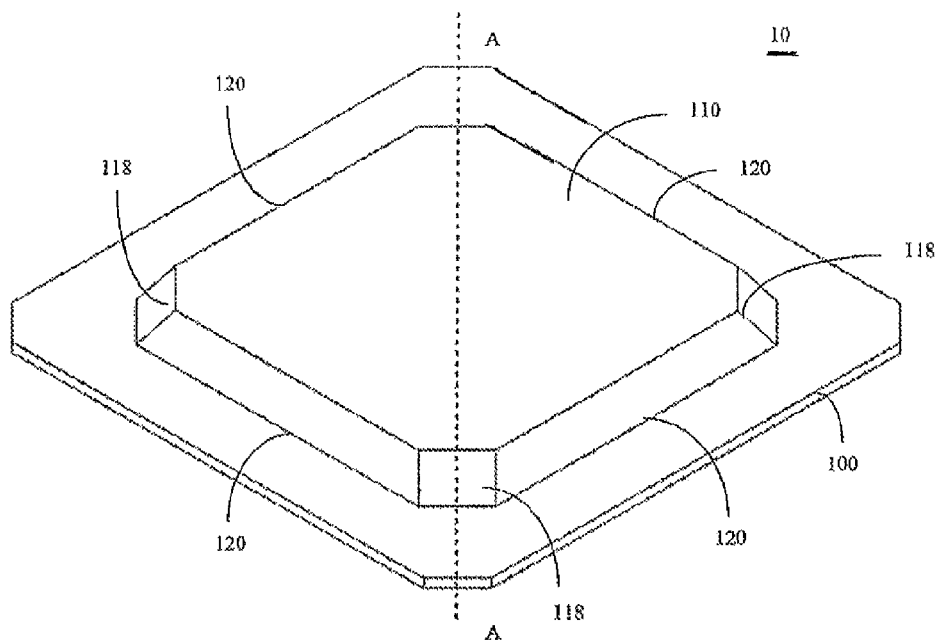
FIG. 1 is a perspective view of a conventional molded BGA package.
Figure 2:
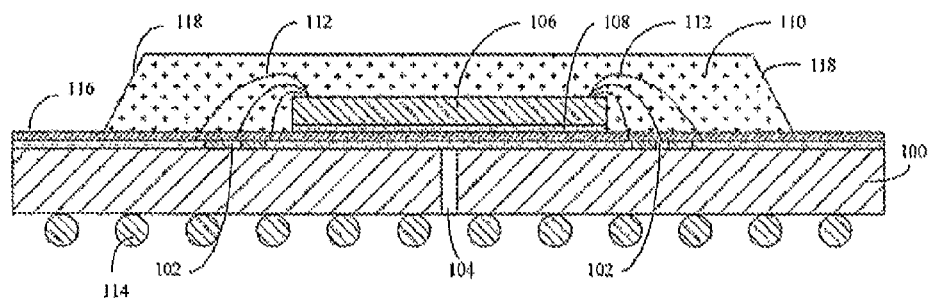
FIG. 2 is a cross-sectional view of the molded BGA package of FIG. 1 along line "A-A"
Figure 3:
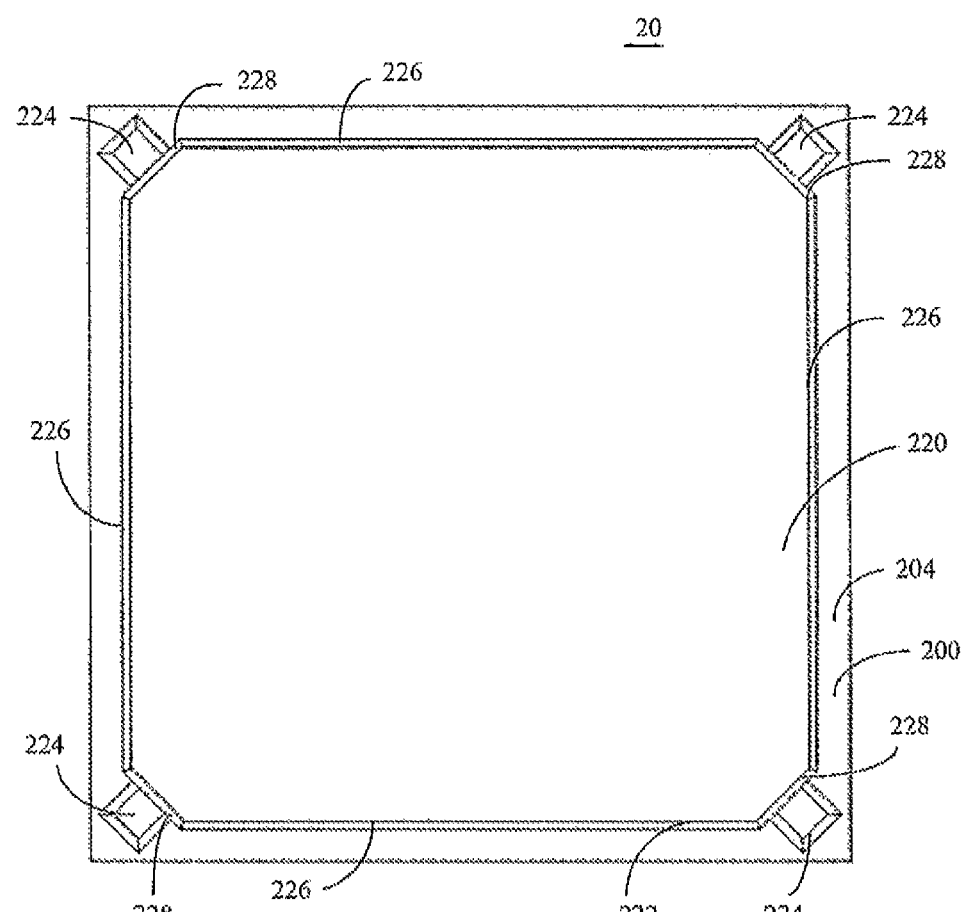
FIG. 3 is a top view of a PBGA package according to one embodiment of the present invention.
Figure 4:
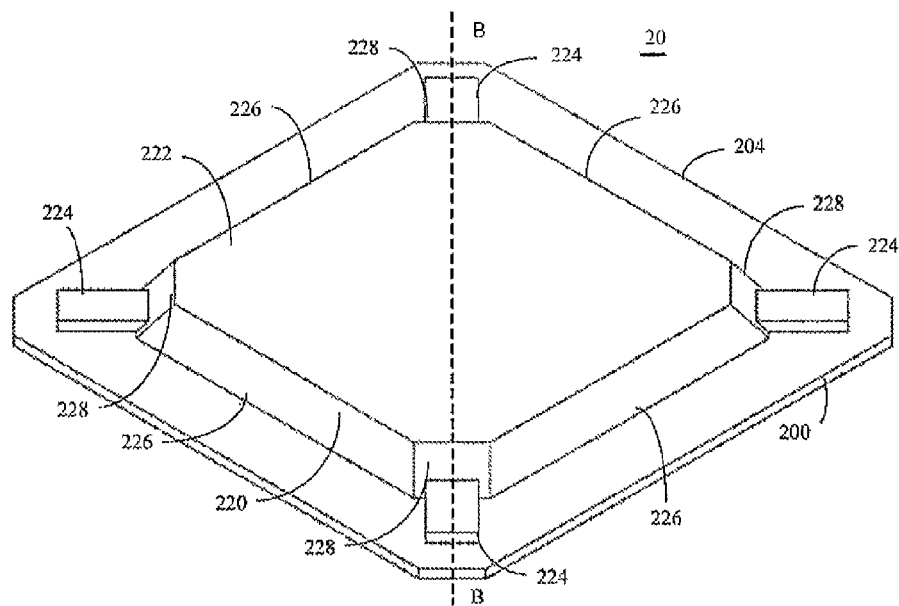
FIG. 4 is a perspective view of the PBGA package of FIG. 3.
Figure 5:
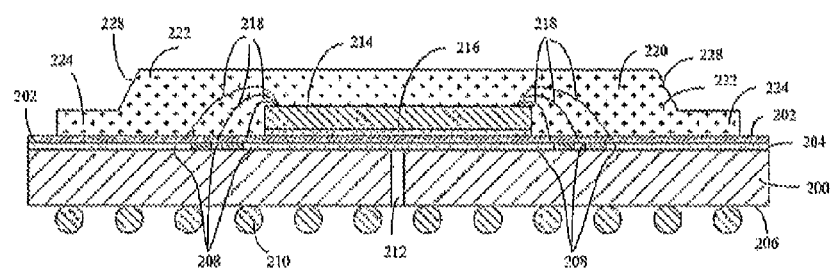
FIG. 5 is a cross-sectional view of the PBGA package of FIG. 4 along line "B-B"

Referring now to FIGS. 3-5, a PBGA package 20 according to one embodiment of the present invention is shown. The PBGA package 20 includes a substrate 200 formed of, for example, a ceramic material, or a plastic material such as epoxy-glass. The substrate 200 may comprise a plurality of alternating conductive and insulative layers, as is known in the art. The substrate 200 is covered with a solder mask 202, and has an upper surface 204 and a lower surface 206. A plurality of conductive traces 208, shown formed along the upper surface of the substrate 200, are electrically connected to a plurality of electrical contacts 210 by way of a plurality of vias 212 (only one is shown), as is known in the art. The electrical contacts 210 may comprise an array of conductive balls, such as C4 or C5 solder balls, that allow electrical connection between the semiconductor package 20 and external electronic components, such as printed circuit boards (PCBs). Alternatively, other conventional electrical connectors, such as conductive pins, may be used instead of solder balls.

A semiconductor die 214, for example, a microcontroller, microprocessor, System on a Chip (SOC), or application specific integrated circuit (ASIC), is attached to the upper surface 204 of the semiconductor substrate 200 with a die attach material 216, such as epoxy. In the embodiment shown, electrical connection between bond pads (not shown) on the die 214 and the conductive traces 208 in the substrate 200 is provided by bond wires 218. However, it will be understood by those of skill in the art that the present invention is limited to wire bond packages.

To protect the die 214 and bond wires 218, a mold cap 220 is formed on the upper surface 204 of the substrate 200. The mold cap 220 may be formed on the substrate upper surface 204 by a transfer or injection molding process, which will be discussed in greater detail below. The height of the mold cap 220 from the upper surface 204 of the substrate 200 is sufficient to fully cover the die 214 and the bond wires 218. The material used to the form mold cap 220 is not critical, and commercially available plastic or encapsulant materials may be used as a matter of design choice.

The mold cap 220 has a mold body 222 and a plurality of extensions 224 that extend outwardly from the mold body 220. The mold body also has four sides 226 and four corners 228. In the embodiment shown, each of the four sides 226 of the mold body 222 is sloped to facilitate removal of the semiconductor package 200 from a cavity bar (not shown). Also, each of the four corners 228 of the mold body 222 is clipped or chamfered such that adjacent sides 226 of the mold body 222 do not intersect at right angles.

The extensions 224 have a proximal end that is attached to the mold body 222 and a distal end that is spaced from the mold body 222. Thus, the extensions 224 extend towards the sides or peripheral edges of the substrate 200, but preferably do not extend all the way to the peripheral edges of the substrate 200. In one embodiment, a height of the extensions 224 is less than a height of the mold body 222. For example, in a preferred embodiment, the height of the extensions 224 is about one-third (⅓) the height of the mold body 222. The extensions 222 can be shaped as a rectangle having a radius or flat top, which can be adjusted by adjusting the shape of the cavity bar. In the embodiment shown, each extension 224 has a length that is about two-thirds (⅔) the distance from the corresponding chamfered corner 228 to the corner of the substrate 200 along the diagonals of the rectangular substrate 200 (see, e.g., line "B-B". The extensions 222 preferably cover at least 50% of the exposed solder mask 202 at the corners 228, which reduces the risk of solder mask 202 cracking.

Fabrication of semiconductor packages according to the present invention is performed in a manner similar to conventional transfer or injection molding processes, except that the shape of the cavity bars is designed with extensions at the corners.

Figure 6:
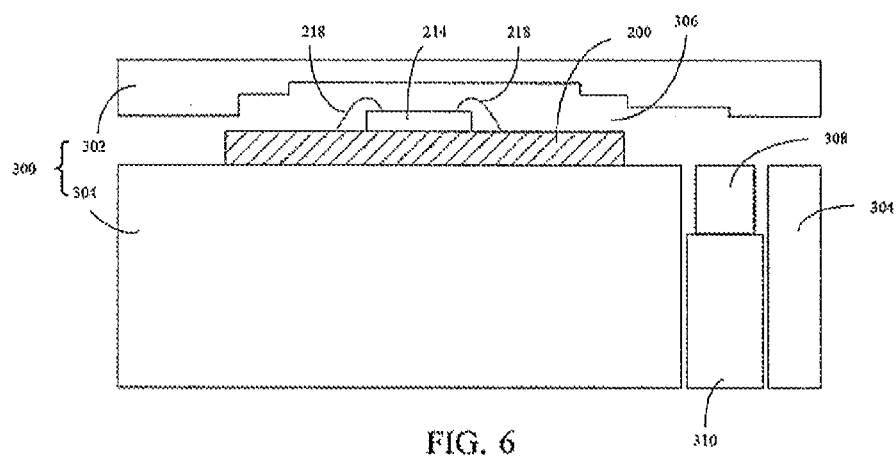
FIG. 6 is a cross-sectional view illustrating a mold chase for performing a molding process according to an embodiment of the present invention.

FIG. 6 is a cross-sectional view illustrating a mold 300 for performing a molding process according to an embodiment of the present invention, which is generally described with respect to the substrate 200. Note that although just one package is shown being formed, it should be understood by those of skill in the art that an array of packages may be formed simultaneously. The mold 300 includes an upper mold section 302 and a lower mold section 304. Mold sections 302 and 304 in one embodiment are designed as removable cavity bars that fit within a chase (not shown). Platens (not shown) are used to force together the sections 302, 304 during the molding process, and separate the sections 302, 304 after the molding process is completed.

After the die 214 chip is attached and electrically connected to the substrate 200, the substrate and die assembly is placed in the mold 300 and then the assembly is encapsulated.

The upper mold section 302, sometimes referred to as the runner bar, contains a mold cavity 306 for the insertion of a mold material 308. The lower mold section 304, sometimes referred to the "cavity bar", mates with upper mold section 302 and together they define an opening for the insertion of a transfer ram 310 via the mold cavity 306 into the upper mold section 302. The mold cavity 306 is sized and shaped such that its interior volume allows the mold material 308, when filled, to be formed in a shape in accordance with the present invention, i.e., a mold cap with chamfered corners and extensions at the chamfers. In operation, the transfer ram 310 is pushed into the mold cavity 306, which causes the mold material 308 to flow into and completely fill the mold cavity 306. The mold material 308 is then cured. Curing is performed according to known techniques.

As mentioned above, a plurality of semiconductor packages 20 in accordance with the present invention can be manufactured at the same time in a strip or array configuration including multiple substrates 200, which are later separated or "singulated", after the molding process. Consequently, packaged electronic devices according to the invention can be produced quickly and at low cost.

While various embodiments of the present invention have been illustrated and described, it will be clear that the present invention is not limited to these embodiments. Numerous modifications, changes, variations, substitutions, and equivalents will be apparent to those skilled in the art, without departing from the spirit and scope of the present invention, as described in the claims.

The invention claimed is:
1. A semiconductor package, comprising:
a substrate having an upper surface, a lower surface, and outer peripheral edges, wherein a plurality of conductive traces are formed on the upper surface of the substrate, a plurality of electrical contacts are formed on the lower surface of the substrate, and a plurality of vias are formed in the substrate to electrically connect the plurality of conductive traces and electrical contacts;
a solder mask formed over and covering the substrate upper surface;
a semiconductor die attached on the upper surface of the substrate; and
a mold cap, formed on the upper surface of the substrate to cover the conductive traces, the semiconductor die, and at least part of the solder mask, wherein the mold cap includes,
a mold body having chamfered corners, and
a plurality of extensions respectively extending from each the chamfered corners, wherein the extensions extend from the chamfered corners towards the edges of the substrate and distal ends of the extensions are spaced from the substrate edges, wherein a height of the plurality of extensions is less than a height of the mold body.

2. The semiconductor package of claim 1, wherein the plurality of extensions have a length that is about two-thirds the distance from the chamfered corners of the mold body to corresponding corners of the substrate.

3. The semiconductor package of claim 1, wherein the plurality of extensions have a height that is about one-third the height of the mold body.

4. The semiconductor package of claim 1, wherein the plurality of extensions are rectangular shaped and have a substantially flat upper surface.

5. The semiconductor package of claim 1, wherein the plurality of extensions are formed together with the mold body.

6. The semiconductor package of claim 1, wherein the electrical contacts comprise a plurality of conductive balls attached to the lower surface of the substrate.

7. The semiconductor package of claim 1, wherein the sides of the mold body have a slope.

8. The semiconductor package of claim 1, wherein the semiconductor die is electrically connected to the conductive traces of the substrate with bond wires.

* * * * *